United States Patent
Leuschner (10) Patent No.: US 7,643,332 B2
(45) Date of Patent: Jan. 5, 2010

(54) MRAM CELL USING MULTIPLE AXES MAGNETIZATION AND METHOD OF OPERATION

(75) Inventor: Rainer Leuschner, Samoreau (FR)

(73) Assignees: Infineon Technologies AG, Munich (DE); Altis Semiconductor SNC, Corbeil Essonnes Cedex (FR)

( * ) Notice: Subject to any disclaimer, the term of this patent is extended or adjusted under 35 U.S.C. 154(b) by 114 days.

(21) Appl. No.: 11/474,080

(22) Filed: Jun. 23, 2006

(65) Prior Publication Data

US 2007/0297222 A1    Dec. 27, 2007

(51) Int. Cl.
   *G11C 11/00*    (2006.01)
(52) U.S. Cl. .................................. 365/158; 365/148
(58) Field of Classification Search ............ 365/158
   See application file for complete search history.

(56) References Cited

U.S. PATENT DOCUMENTS

| 6,974,708 B2 * | 12/2005 | Horng et al. ............ 438/3 |
| 6,992,910 B1 | 1/2006 | Ju et al. |
| 7,167,391 B2 * | 1/2007 | Sharma et al. ........... 365/173 |
| 7,177,178 B2 * | 2/2007 | Daughton et al. ........ 365/158 |
| 7,348,647 B2 | 3/2008 | Mattheis et al. |
| 2004/0012994 A1 * | 1/2004 | Slaughter et al. ......... 365/158 |
| 2004/0130936 A1 * | 7/2004 | Nguyen et al. ........... 365/158 |
| 2005/0094435 A1 | 5/2005 | Gillies et al. |
| 2005/0174821 A1 | 8/2005 | Zheng et al. |
| 2005/0174828 A1 | 8/2005 | Sharma |
| 2006/0083056 A1 | 4/2006 | Daughton et al. |
| 2007/0189064 A1 * | 8/2007 | Min et al. ................. 365/158 |
| 2007/0243639 A1 * | 10/2007 | Pietambaram et al. ...... 438/3 |

FOREIGN PATENT DOCUMENTS

| DE | 101 28 964 A1 | 12/2002 |
| EP | 1 659 631 A2 | 5/2006 |
| WO | WO 03/054886 A2 | 7/2003 |
| WO | WO 03/077257 A1 | 9/2003 |

\* cited by examiner

*Primary Examiner*—Hoai V Ho
*Assistant Examiner*—Kretelia Graham
(74) *Attorney, Agent, or Firm*—Slater & Matsil, L.L.P.

(57) ABSTRACT

A magnetic random access memory cell includes a free layer structure and a reference layer structure including an anti-ferromagnetic layer structure pinning the magnetization orientation of the reference layer structure, the reference layer structure having a higher magnetic coercivity and being magnetically polarizable bidirectional and parallel to more than one axes by a magnetic field applied during a writing procedure so as to store information in the reference layer structure while heating the anti-ferromagnetic layer structure above its blocking temperature.

42 Claims, 4 Drawing Sheets

FIG 1

PRIOR ART

FIG 3

1) Bit line pulse  ~6 ns 2) cell state sensing and intermediate storage of resistance R1  ~10 ns

| 4 cases to be distinguished: | FreeL | RefL | R1 |
|---|---|---|---|
| | → | → | low |
| | → | ← | high |
| | → | ↑ | medium |
| | → | ↓ | medium |

3) Word line pulse + sensing of R2 at the same time  ~10 ns

| 4 cases to be distinguished: | FreeL | RefL | R2 |
|---|---|---|---|
| | ↑ | → | medium |
| | ↑ | ← | medium |
| | ↑ | ↑ | low |
| | ↑ | ↓ | high |

4) Final storage and data transfer  ~10 ns

| 4 cases to be distinguished: | | |
|---|---|---|
| | R1 = low AND R1 < R2 | bit 00 |
| | R1 = high AND R1 > R2 | bit 11 |
| | R1 = medium AND R1 > R2 | bit 01 |
| | R1 = medium AND R1 < R2 | bit 10 |

FIG 4

MRAM CELL USING MULTIPLE AXES MAGNETIZATION AND METHOD OF OPERATION

TECHNICAL FIELD

The present invention relates to magnetic random access memory (MRAM) cells, and more particularly to MRAM cells employing multiple axes magnetization, and methods of operation.

BACKGROUND

Magnetic random access memory (MRAM) devices are emerging as possible replacements for conventional RAM memory structures such as dynamic and static RAM structures. MRAM devices exhibit similar access speeds and greater immunity to radiation compared to conventional DRAM and SRAM structures, and advantageously do not require applied power to retain their logical state.

Figure 1:
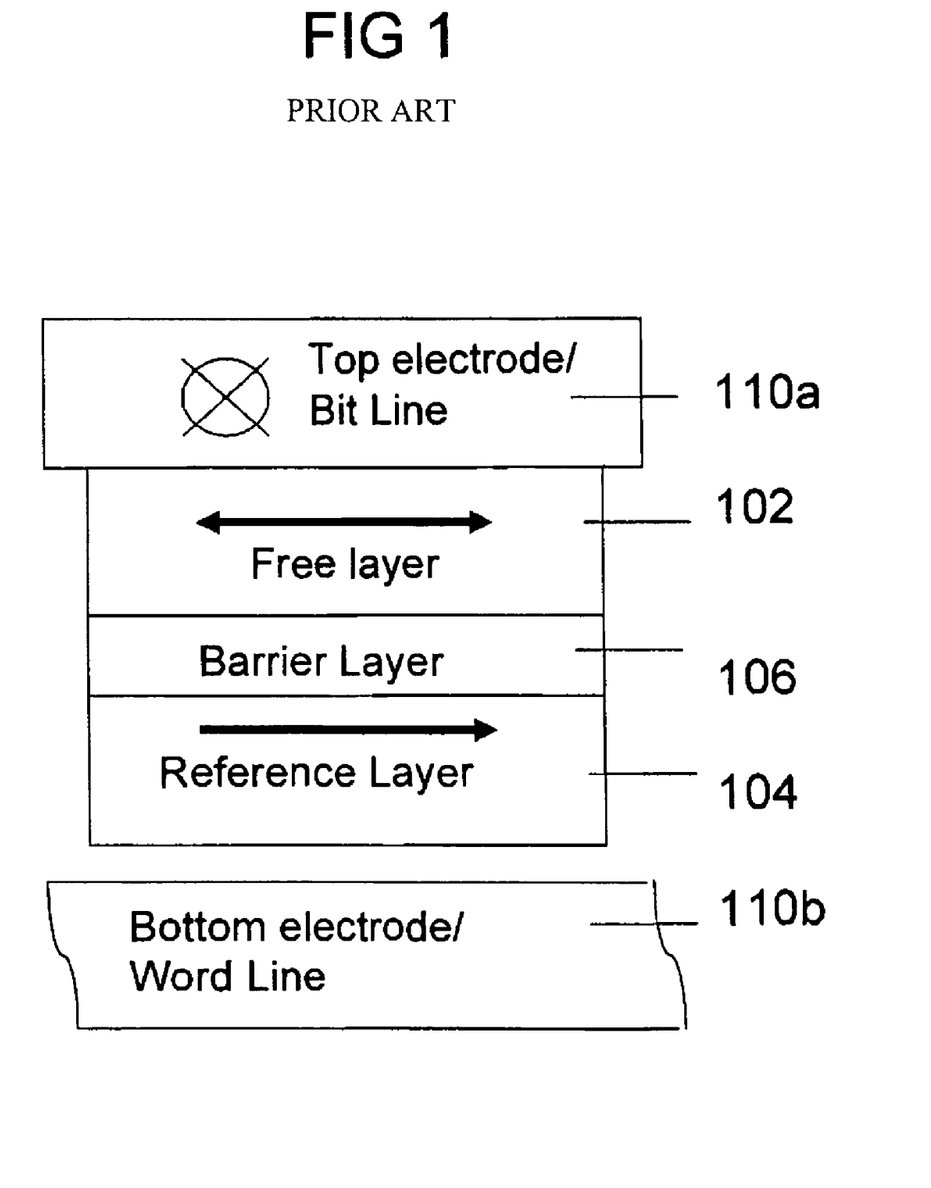
FIG. 1 illustrates a conventional MRAM cell structure known in the art.

FIG. 1 illustrates a block diagram of a conventional MRAM cell structure. The MRAM cell structure generally includes a so-called free layer 102, a reference layer 104, and a barrier junction 106 there between. The free layer 102 and the reference layer 104 are formed from materials that possess a particular magnetic orientation, the relative orientations of which are either parallel, in which case the MRAM cell has a relatively low tunnel magneto resistance between top and bottom electrodes 110a and 110b, or anti-parallel, in which case the MRAM cell has a relatively high tunnel magneto resistance between top and bottom electrodes 110a and 110b.

The free layer 102 will typically consist of a material that has a lower magnetic coercivity, and can, therefore, more easily be re-oriented, compared to the reference layer 104, which is supposed to keep its magnetic polarization. Reading the state of the MRAM cell is performed by passing a predefined current between the top and bottom electrodes 110a and 110b, and monitoring the resulting voltage. Programming can be performed using one of two conventional techniques. One programming technique is to apply a bit line electrode field current and a word line electrode field current along a particular direction via a top electrode and a bottom electrode to a particular MRAM memory cell located at the top electrode and bottom electrode intersection, the current applied at a sufficient magnitude to generate a magnetic field that aligns the magnetic orientation of the free layer accordingly. However, this approach requires the generation of high current drive levels, resulting in high power dissipation levels and the requirement of large gate periphery transistors to handle the peak current conditions.

Thermally-assisted programming represents another MRAM programming technique known in the art. In this approach, a heating current is supplied across the MRAM's barrier layer, the resistance of which causes the free layer to heat to a predefined temperature. The free layer is preferably constructed from a material that exhibits a decreasing magnetic coercivity with increasing temperature, such that when the free layer is sufficiently heated, lower magnitude field currents can be used to re-orient an existing magnetic polarization of the free layer.

Although thermally-assisted programming contributes to a reduction of a space per bit ratio, there are still requests for a further reduction of the space per bit ratio.

SUMMARY OF THE INVENTION

The present invention provides a MRAM cell that enables storage of more than one bit per cell. Enhanced storage capacity per cell permits the implementation of MRAM memory devices and arrays having at least double of the conventional storage capacity at same chip size and same technology.

A magnetic random access memory cell including a free layer structure and a reference layer structure including an anti-ferromagnetic layer structure pinning the magnetization orientation of the reference layer structure, the reference layer structure having a higher magnetic coercivity and being magnetically polarizable bidirectional and parallel to more than one axes by a magnetic field applied during a writing procedure so as to store information in the reference layer structure while heating the anti-ferromagnetic layer structure above its blocking temperature.

These and other features of the invention will be better understood in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which.

For clarity, previously identified features retain their reference indicia in subsequent drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
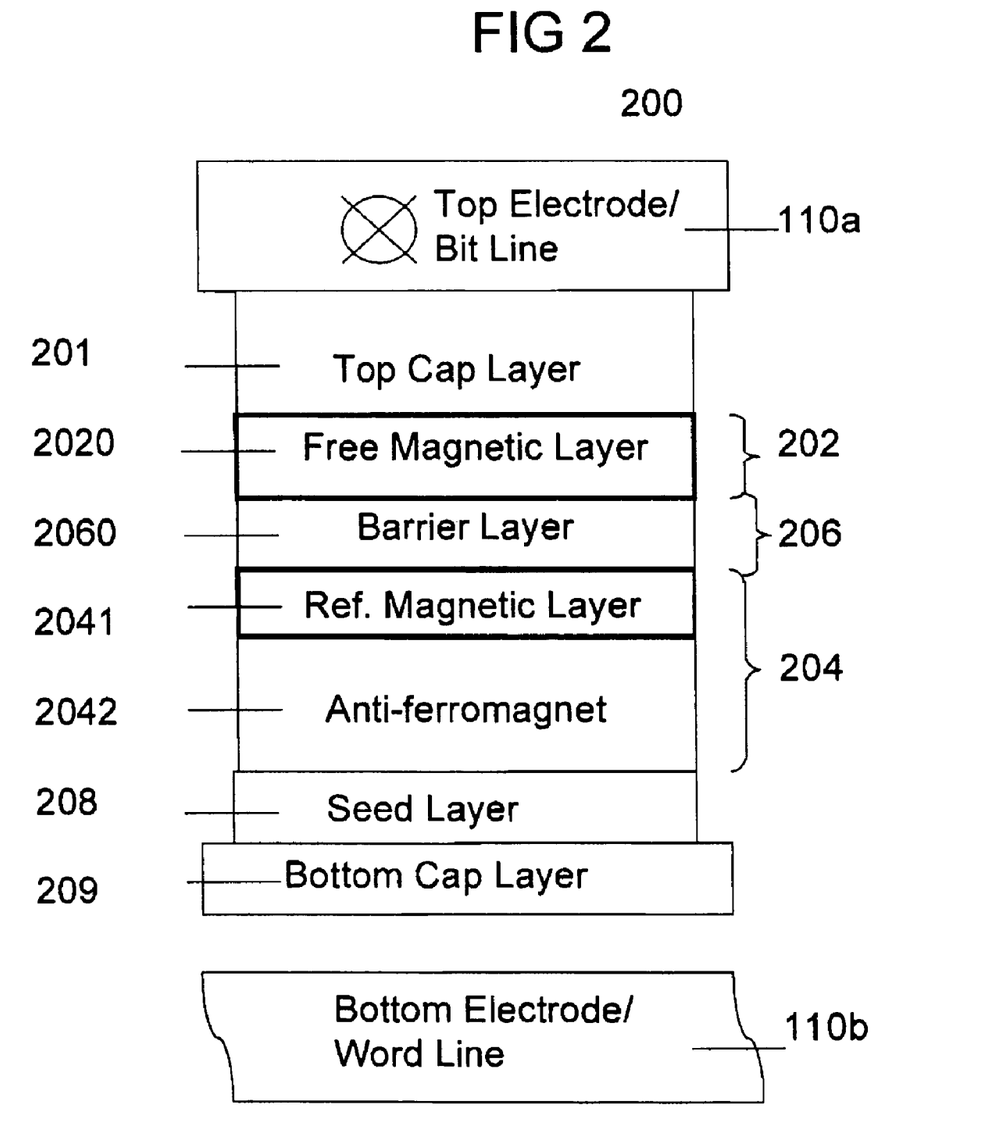
FIG. 2 illustrates an exemplary MRAM cell structure in accordance with the present invention.

FIG. 2 illustrates an exemplary MRAM cell structure 200 in accordance with an embodiment of the present invention. The exemplary MRAM cell structure 200 comprises a 'free' layer structure 202, a reference layer structure 204 and a barrier layer structure 206, which is disposed between the free layer structure 202 and the reference layer structure 204. Opposite the barrier layer structure 206 the free layer structure 202 is coupled to a top cap layer 201 and the reference layer structure 204 is coupled to a bottom cap layer 209 via a seed layer 208. A top electrode, which is in the exemplary shown embodiment called bit line electrode 110a, is coupled to the top cap layer 201 and a bottom electrode, which is in the exemplary shown embodiment called word line electrode 110b, is located next to the bottom cap layer 209.

A current path is provided between the bit line electrode 110a, through the top cap layer 201, the free layer structure 202, the barrier layer structure 206, the reference layer structure 204, the seed layer 208 and the bottom cap layer structure 209. The current path being operable, for example, in conducting read current via a switching transistor connected to the bottom cap layer 209 for determining the state of the MRAM cell 200.

The free layer structure 202 may be composed of one or more layers, which together have a magnetic polarization that can be altered in the presence of a magnetic field. In an exemplary embodiment, the free layer structure 202 consists of a 'free' magnetic layer 2020 made of, e.g., cobalt iron boron (CoFeB), cobalt iron nickel (CoFeNi), nickel iron (NiFe) or cobalt iron boron silicon molybden (CoFeBSiMo). In one embodiment of the invention, the free magnetic layer 2020 has a thickness of 15-25 Angstroms. In one embodiment of the invention, the 'free' magnetic layer 2020 is made of CoFeB with a boron content of 5 to 30%, e.g., with a boron content of about 8%.

In a further exemplary embodiment the free layer structure 202 is adjusted to have a very low activation energy, i.e. the free layer structure 202 has a low magnetic coercivity and its magnetic polarization can be altered in the presence of a weak magnetic field (activation energy $Ea \sim \frac{1}{2}\mu_0 M_s^2 \pi/4 \, a \, b \, c^2 \, (1/b - 1/a) \sim 20 \, kb \, T$; a=length, b=width, c=thickness of free layer, Ms=saturation magnetization, μ0=vacuum permeability, kb=Bolzmann constant). Furthermore, in a particular embodiment the free layer structure 202 is construed as a round element (or an element with a low aspect ratio=length/with<1.5) and has an easy axis. In the exemplary embodiment the easy axis is defined only by an uniaxial anisotropy provided by a material, e.g., by cobalt iron boron (CoFeB).

In a further embodiment of the invention the easy axis is oriented parallel to a magnetic field generated by a field current through the bit line electrode 110a. Bidirectional field current drivers are operable to send the field current in both directions through the bit line electrode 110a and through the word line electrode 110b, therewith a polarization of the free layer structure 202 in both directions parallel to a respective axis is attainable, with the axis being perpendicular to the direction of the field current, i.e., perpendicular to the longitudinal extension of the bit line electrode 110a.

In the particular embodiment shown, the bit line electrode 110a has a longitudinal plane into and out of the drawing, whereas the word line electrode 110b has a longitudinal plane in the plane of the drawing, although other orientations may be employed in alternative embodiments of the invention.

The reference layer structure 204 according to the present invention represents the layer structure in which information is stored. The reference layer structure 204 may be composed of one or more layers that together have a magnetic polarization that can be altered in the presence of a magnetic field. Compared to the free layer structure 202 the reference layer structure 204 has a higher magnetic coercivity.

In an exemplary embodiment the reference layer structure 204 is construed to exhibit a temperature-dependent coercivity, which is a basis for thermally assisted programming. For that in a further exemplary embodiment the reference layer structure 204 is composed of a reference magnetic layer 2041 and an anti-ferromagnetic layer 2042 coupled thereto. In one embodiment of the invention the reference magnetic layer 2041 is made of cobalt iron (CoFe) or cobalt iron boron (CoFeB) or of a bilayer including nickel iron/cobalt iron boron (NiFe/CoFeB) and the anti-ferromagnetic layer 2042 is made of iridium manganese (IrMn), iron manganese (FeMn), nickel manganese (NiMn), or platinum manganese (PtMn).

In a further particular embodiment the reference magnetic layer 2041 has a thickness of about 10-25 Angstroms and the anti-ferromagnetic layer 2042 has a thickness of about 20-150 Angstroms.

The reference layer structure 204 that includes an anti-ferromagnetic layer 2042 exhibits on one hand a high magnetic coercivity with the anti-ferromagnet being active, i.e., below its blocking temperature, e.g., at room temperature. On the other hand, the reference layer structure 204 exhibits a relatively low coercivity with the anti-ferromagnet being inactive, i.e., above its blocking temperature. This influencing effect of an anti-ferromagnet upon a ferromagnet is sometimes also called pinning. For thermally assisted programming the anti-ferromagnetic layer 2042 has to be heated first before a magnetic field can alter the polarization of an attached magnetic layer, which is, for example, the reference magnetic layer 2041 in the exemplary embodiment previously mentioned. Heating can be caused by a write current through the barrier layer structure 206, by an additional heating layer, by other heating means or a combination of these.

The barrier layer structure 206 is disposed between the free layer structure 202 and the reference layer structure 204, i.e., in the exemplary embodiments previously described in detail between the free magnetic layer 2020 and the reference magnetic layer 2041. The barrier layer structure 206 is a magnetic tunneling junction (MTJ) of the MRAM cell 200. The barrier layer structure 206 may include numerous layers and more than one magnetic tunneling junction (MTJ). In an exemplary shown embodiment the barrier layer structure 206 consists of a non magnetic barrier layer 2060, whereby in an exemplary embodiment the barrier layer 2060 is made of magnesia (MgO) and in a particular embodiment it has a thickness of about 5-12 Angstroms.

In one embodiment a seed layer 208 is provided on which the anti-ferromagnetic layer 2042 is based. The seed layer 208 is made of a crystalline ferromagnetic material, which causes good growth during manufacturing and therewith good texture of the anti-ferromagnetic material, which in turn leads to a high pinning capability of the anti-ferromagnetic layer 2042. In a further embodiment the seed layer 208 is made of nickel iron (NiFe) and has a thickness of approximately 10-30 Angstroms.

In an exemplary embodiment a top cap layer 201 is formed on top of a layer stack, e.g., on top of the free layer structure 202, to protect the magnetic materials from exposure to the ambient. Accordingly, a bottom cap layer 209 is provided on the bottom of the layer stack. In one embodiment of the invention, the bottom cap layer 209 may be formed under the existing seed layer 208, or the seed layer 208 may be formed on top of the existing bottom cap layer 209. Besides protective purposes, the top cap layer 201 may be used to make electrical contact with an upper level wiring, e.g., the bit line electrode 110a, and the bottom cap layer 209 may be used to provide electrical contact with a lower level wiring, e.g., to the read current switching transistor.

Both cap layers 201, 209 are typically formed from a conductive material such as tantalum (Ta), tantalum nitride (TaN), titanium (Ti) or titanium nitride (TiN). In an exemplary embodiment the top cap layer 201 is made of tantalum nitride (TaN) and has a thickness of approximately 100 Angstroms. The bottom cap layer 209 for example may be a double layer composed of a tantalum nitride (TaN) layer with a thickness of 100 Angstroms and a tantalum (Ta) layer with a thickness of approximately 20 Angstroms.

Those skilled in the art will recognize that the order of the layer stack may be reversed. That is, the reference layer structure 204 may be on top of the stack and the free layer structure 202 may be underneath the barrier layer structure 206. In this case, on top of the reference layer is a seed layer (a seed layer is usually provided below the anti-ferromagnet in order to provide the right texture for the anti-ferromagnets growth).

In the embodiment shown, the bit line electrode 110a has a longitudinal plane into and out of the drawing, and the word line electrode 110b has a longitudinal plane in the plane of the drawing, although other orientations especially those deviating from a 90 degree angle between the electrodes and orientations with additional electrodes may be employed in alternative embodiments of the invention.

Programming a MRAM cell structure means writing of information into the MRAM cell structure. As already mentioned, with a MRAM cell structure in accordance with the present invention, information will be stored in the reference layer structure 204. Information is represented by the axis and the direction of the axis the reference layer structure 204 is polarized. For example, having two axes available, two bits can be stored, and with four axes available, three bits can be stored. In general, an amount of axes a needed for n bits can be calculated by the formula $a=2^{n-1}$. Axes of polarization can be provided by magnetic fields generated by field currents through field electrodes, e.g., the bit line electrode 110a and the word line electrode 110b, but not limited to these.

Although in alternative embodiments of the invention a magnetic field can be taken as a result out of more than one generated magnetic fields, i.e., when at least two electrodes simultaneously generate their own magnetic field, and the axis of the resulting magnetic field can furthermore be adjusted by the power of field currents applied, in the succeeding for ease of explanation generation of a magnetic field is supposed to be done only by one electrode a time unless otherwise explicitly specified.

In one exemplary embodiment available electrodes are limited to the bit line electrode 110a and the word line electrode 110b and with the aforesaid restriction there are only two axes for polarization available. Field current through the bit line electrode 110a will generate a magnetic field with a polarizing direction perpendicular to the bit line electrode 110a and a field current through the word line electrode 110b will generate a magnetic field with a polarizing direction perpendicular to the word line electrode 110b. With an exemplary embodiment wherein it can be assumed that the longitudinal extension of the bit line electrode 110a is perpendicular to that of the word line electrode 110b, the bit line electrode 110a generates a polarization axis parallel to the longitudinal extension of the word line electrode 110b and vice versa.

In an exemplary embodiment programming of permutations of two bits, which are '00', '01', '10', '11' may be aligned in a way that a first digit selects the axis, e.g., '0x' for the polarization axis created by a bit line field, and a second digit selects the polarization direction, i.e., the direction of the field current sent through an electrode.

The magnetic field generated for programming has to be strong enough to alter the polarization of the reference layer structure 204 of a selected MRAM cell. With a cell structure for thermally assisted programming, selection can be made by heating the selected cell above the blocking temperature of the anti-ferromagnetic layer 2042 attached to the reference magnetic layer 2041. Alternative embodiments not supporting thermally assisted programming may use an additional selecting electrode with its magnetic field supporting the intended magnetic field at the intersection where the cell is located.

Since the free layer structure 202 of an MRAM cell according to the invention has a low magnetic coercivity, a magnetic field applied for programming will also alter the polarization of the free layer structure 202, which does not harm at all. But the magnetic field of the free layer structure 202 has to be overcome by the field strength of the magnetic field generated by an electrode, e.g., the bit line electrode 110a.

Figure 3:
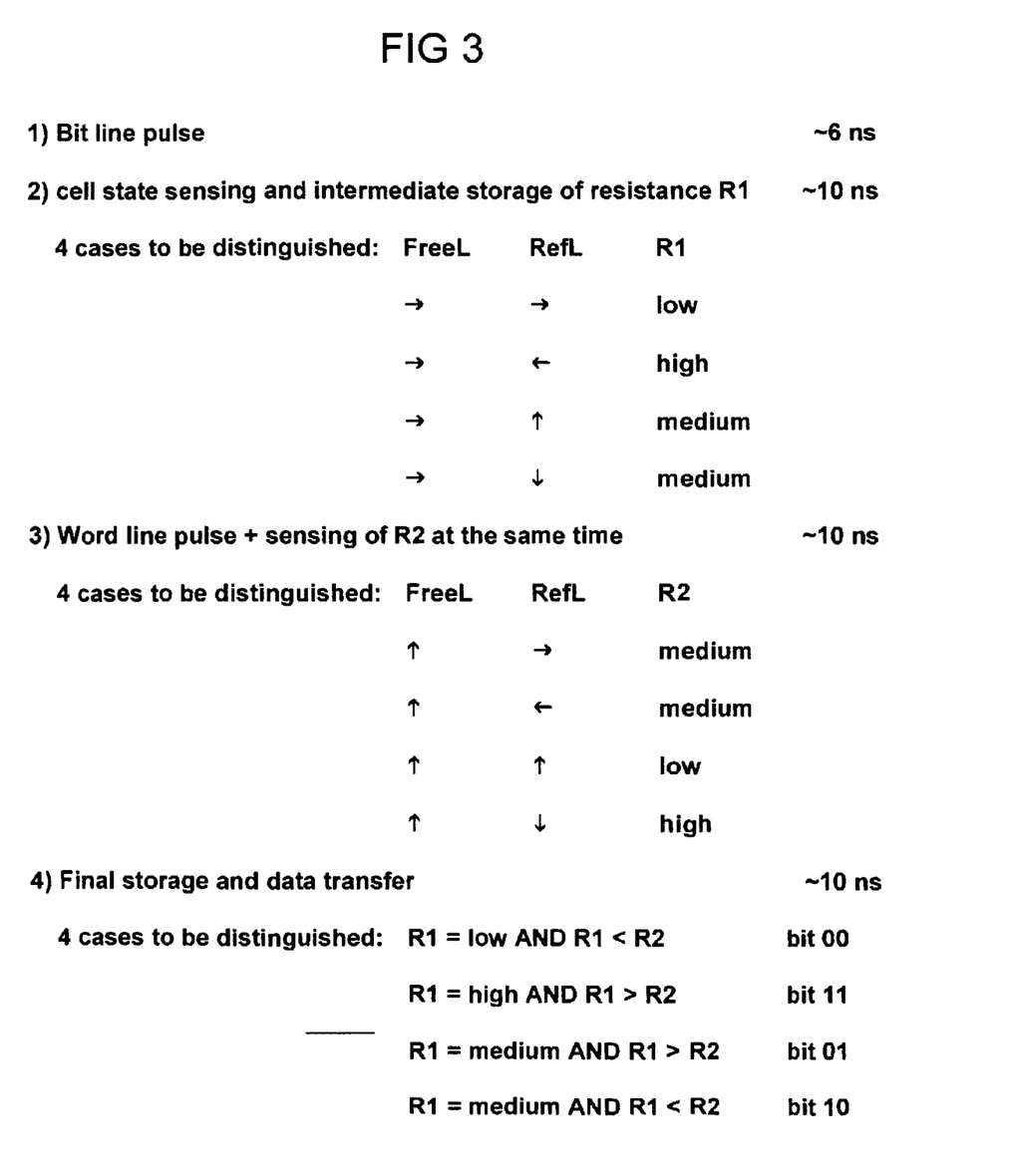
FIG. 3 illustrates an exemplary method for reading information in accordance with the present invention.

FIG. 3 illustrates an exemplary method for reading information in accordance with one exemplary embodiment of the present invention. This method refers to an exemplary embodiment of an MRAM cell according to the invention as shown in FIG. 2. A sequence of three steps for reading together with possible polarization directions FreeL, RefL of the free layer structure 202 and the reference layer structure 204 as well as an exemplary bit configuration 'bits' is stated respectively, that is determinable out of a given polarization constellation.

For a read operation the polarization of the reference layer structure 204 remains stable, therefore no heating or other selection means usable for programming will be active any time. An exemplary read operation starts, as a first step, with generating a magnetic field that is polarizing the free layer structure 202 to a definite direction. This may be done by pulsing a field current of a known direction through a closest located electrode, which in the exemplary embodiment is the bit line electrode 110a. With a free layer structure 202 having an anisotropy parallel to the magnetic field generated by that electrode, it is made sure, that the free layer structure 202 is in its easy axis an will remain there, e.g., at least for a short time (<100 ns), even if the magnetic field of the electrode disappears.

After the field current is switched off, in a second step, a read current is applied through the layer stack by activating the read switching transistor. In dependence of the magnetic polarization of the reference layer structure 204 in relation to the free layer structure 202 three different voltage differences, i.e., magneto resistances can be measured. A low resistance RL means that the polarization of both layer structures have the same axis and the same direction, which in the exemplary embodiment may represent a stored information with two bits '00'. A high resistance RH in the contrary means that the polarization of both layer structures have the same axis but opposing directions, which in the exemplary embodiment may represent a stored information with two bits '01'. If a measured resistance Rm is between the low and the high resistance values no statements in relation to the stored information can be made.

In a third step, a field current in a definite direction is pulsed through another electrode, which in the exemplary embodiment is the word line electrode 110b. The magnetic field generated by the word line electrode 110b alters the polarization of the free layer structure 202 into an axis that is, within the exemplary embodiment, perpendicular to the axis generated within the first step.

Since the word line electrode 110b is not used for reading, generation of the magnetic field and reading can be done simultaneously, which reduces access time and, in an embodiment with a free layer structure 202 having a low magnetic coercivity and/or an easy axis deviating from the axis of the generated magnetic field, it can therewith be made sure that the polarization of the free layer will not change during reading.

By analogy with the second step a low resistance RL read means that the polarization of both layer structures have the same axis and the same direction, which in the exemplary embodiment may represent a stored information with two bits '10'. A high resistance RH in the contrary means that the polarization of both layer structures have the same axis but opposing directions, which in the exemplary embodiment may represent a stored information with two bits '11'. If a measured resistance Rm is between the low and the high resistance value no statements in relation to the stored information can be made.

In a particular embodiment a read operation can be optimized in view of a reduced average access time by stopping the read operation at the end of the second step, if in the second step a definite information, e.g., either '00' or '01', has been determined. In the exemplary embodiment a read access time can be calculated as follows. The first step will take about 6 ns, the second step will take 10 ns and the third step will take another 10 ns. For data transfer another 10 ns have to be assumed which turns to 36 ns for two bits in total. Without the third step it would be 26 ns and under the assumption that in 50% of all read operations the third step can be cut, an average read access time pro bit of 15.5 ns will result compared to 18 ns with a constant third step.

In another particular embodiment those resistances Rm lying between the low and high resistances RL, RH may be used for verification of a proper operation of the MRAM cell and its corresponding drivers, therefore, requiring a constant third step read operation.

Figure 4:
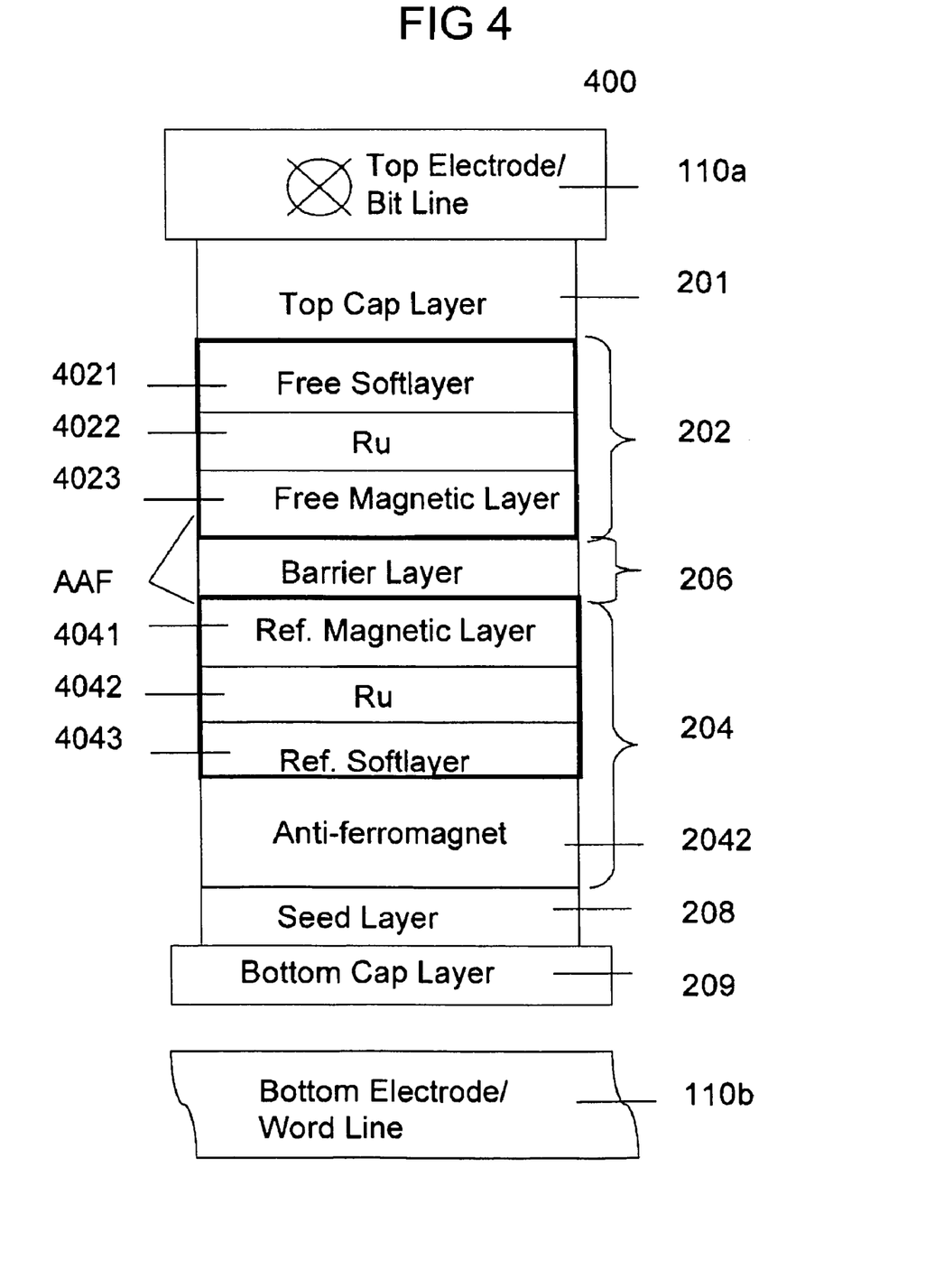
FIG. 4 illustrates another exemplary MRAM cell structure in accordance with the present invention.

FIG. 4 illustrates another MRAM cell structure in accordance with the present invention. This MRAM cell structure will be called an enhanced MRAM cell structure 400 and it differentiates from the MRAM cell structure of FIG. 2 only in the construction of the free layer structure 202 and the reference magnetic layer 2041 of the reference layer structure 204. Therefore, description of all other features of the exemplary MRAM cell structure of FIG. 2 is also applicable for the same features of the enhanced MRAM cell structure 400. Those features have also retained their reference indicia. Description of the enhanced MRAM cell structure 400 has also to be understood with reference to FIG. 3 and its description, which is also only with minor deviations, which are explained, applicable to the enhanced MRAM cell structure.

The enhanced MRAM cell structure 400 includes an artificial anti-ferromagnet AAF instead of a single free magnetic layer 2020 (see FIG. 2) in the free layer structure 202 and an artificial anti-ferromagnet AAF instead of a single reference magnetic layer 2041 (see FIG. 2) in the reference layer structure 204. An artificial anti-ferromagnet AAF includes at least one pair of magnetic layers, polarizing themselves in opposite directions, which is called anti-parallel, and being coupled by an anti-ferromagnetic layer, conventionally made of ruthenium (Ru), which is disposed between. Artificial anti-ferromagnets AAF are known to provide a closed flux switching behavior, which avoids the relatively high demagnetization fields that are encountered during switching of a single magnetic layer.

In the exemplary embodiment the free layer structure 202 comprises therewith a 'free' magnetic layer 4023 on top of the barrier layer structure 206, a non-magnetic coupling layer 4022 on top of the free magnetic layer 4023 and as a corresponding layer to the free magnetic layer 4023 a 'free' softlayer 4021 on top of the non-magnetic coupling layer 4022. In a particular embodiment the free magnetic layer 4023 is made of cobalt iron boron (CoFeB) and has a thickness of 15-25 Angstroms. In an exemplary embodiment of the invention, the 'free' softlayer 4021 is made of, e.g., cobalt iron boron (CoFeB), cobalt iron nickel (CoFeNi), nickel iron (NiFe) or cobalt iron boron silicon molybden (CoFeBSiMo). In one embodiment of the invention, the 'free' softlayer 4021 has a thickness of 15-25 Angstroms. In one embodiment of the invention, the 'free' softlayer 4021 is made of CoFeB with a boron content of 5 to 30%, e.g., with a boron content of about 8%.

In one embodiment of the invention, the free magnetic layer 4023 is made of a low-Tc (low Curie temperature) material like CoFeSiBMo or CoFeV or CoFeCr.

In an analog manner the artificial anti-ferromagnet AAF of the reference layer structure 204 includes a reference magnetic layer 4041 beneath the barrier layer structure 206, non-magnetic coupling layer 4042 beneath the reference magnetic layer 4041 and as a corresponding layer to the reference magnetic layer 4041 a reference softlayer 4043 beneath the reference anti-ferromagnetic layer 4042. In a particular embodiment the reference magnetic layer 4041 is made of cobalt iron boron (CoFeB) and has a thickness of 18 Angstroms. In one embodiment of the invention, the reference softlayer 4043 is made of a low-Tc (low Curie temperature) material like CoFeSiBMo, CoFeV or CoFeCr.

In addition to the already-mentioned advantages of a lower demagnetization field, an artificial anti-ferromagnet AAF allows a specific adjustment of its magnetic momentum by selecting material and thickness of the pair of magnetic layers in relation to each other. Besides that, the present invention uses an additional adjusting measure that can be seen in an adjustment of the magnetic field in dependence of temperature.

In the succeeding description, the embodiments may also exploit the explained attitudes of the free layer structure 202, e.g., easy axis, easy axis either only defined by uniaxial anisotropy of CoFeB or by an additional small shape anisotropy (aspect ratio of cell<1.5) and anisotropy parallel to field created by the bit line electrode 110a.

In a particular embodiment the artificial anti-ferromagnet AAF forming the free layer structure 202 is a little unbalanced at room temperature in order to have a low offset field that requires a low switching field for read operations. For example, this can be done by selecting a free softlayer 4021 with about double the magnetic momentum at room temperature as of the free magnetic layer 4023 made of CoFeB. At high temperature the artificial anti-ferromagnet AAF forming the free layer structure 202 should be balanced in order to create no offset field during programming, which has otherwise to be overcome.

In a particular embodiment the artificial anti-ferromagnet AAF of the reference layer structure 204 is balanced at room temperature in order to have no offset field for read operations. This can be adjusted for example by selecting a reference softlayer 4043 with about the same magnetic momentum at room temperature as of the reference magnetic layer 4041 made of CoFeB. At high temperature, i.e., for programming, the magnetic momentum of the reference magnetic layer 4041 made of CoFeB is larger.

With artificial anti-ferromagnets AAF adjusted as described above lower magnetic fields have to be applied for programming and read operations, which in turn require reduced field currents.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A magnetic random access memory cell, comprising:
  a reference layer structure that includes an anti-ferromagnetic layer structure pinning a magnetization orientation of the reference layer structure, the reference layer structure being magnetically polarizable bidirectional and parallel to more than one axis by a magnetic field applied during a writing procedure so as to store information of more than one bit in the reference layer structure while heating the anti-ferromagnetic layer structure above its blocking temperature; and a free layer structure adjacent the reference layer structure, the reference layer structure having a higher magnetic coercivity than the free layer structure.

2. The magnetic random access memory cell of claim 1, further comprising a non-magnetic tunnel barrier layer structure disposed between said reference layer structure and said free layer structure, wherein said reference layer structure has a higher magnetic coercivity than said free layer structure and said reference layer structure is magnetically polarizable bidirectional and parallel to two different axes by the magnetic field applied during the writing procedure.

3. The magnetic random access memory cell of claim 2, further comprising a word line electrode and a bit line electrode for generating the magnetic field.

4. The magnetic random access memory cell of claim 3, wherein the free layer structure has an easy axis parallel to the magnetic field generated by one of the electrodes.

5. The magnetic random access memory cell of claim 3, wherein the bit line electrode is electrically coupled to the memory cell and the free layer structure has an easy axis parallel to the magnetic field generated by the bit line electrode.

6. The magnetic random access memory cell of claim 4, wherein the free layer structure comprises a cobalt iron boron layer having uniaxial anisotropy defining said easy axis.

7. The magnetic random access memory cell of claim 4, wherein the free layer structure comprises a cobalt iron boron layer having a thickness of approximately 15-25 Angstroms.

8. The magnetic random access memory cell of claim 1, wherein the anti-ferromagnetic layer structure comprises an iridium or an iron manganese layer.

9. The magnetic random access memory cell of claim 8, wherein the anti-ferromagnetic layer structure has a thickness of approximately 20-150 Angstroms.

10. The magnetic random access memory cell of claim 1, wherein the anti-ferromagnetic layer structure comprises a cobalt iron layer or a cobalt iron boron layer.

11. The magnetic random access memory cell of claim 10, wherein the cobalt iron layer or the cobalt iron boron layer has a thickness of approximately 18 Angstroms.

12. The magnetic random access memory cell of claim 1, further comprising a heating current source providing heating current to the magnetic random access memory cell, thereby heating the anti-ferromagnetic layer structure.

13. A magnetic random access memory cell, comprising:
a reference layer structure that includes an anti-ferromagnetic layer structure pinning a magnetization orientation of the reference layer structure;
a free layer structure; and
a non-magnetic tunnel barrier layer structure disposed between the reference layer structure and the free layer structure, the reference layer structure having a higher magnetic coercivity than the free layer structure and the reference layer structure being magnetically polarizable bidirectional and parallel to a magnetic field generated by a bit line electrode and parallel to a magnetic field generated by a word line electrode during a writing procedure so as to store information of more than one bit in the reference layer structure while heating the anti-ferromagnetic layer structure above its blocking temperature.

14. The magnetic random access memory cell of claim 13, wherein:

the bit line electrode is electrically coupled to the memory cell; and
the free layer structure has an easy axis parallel to the magnetic field generated by the bit line electrode.

15. The magnetic random access memory cell of claim 13, wherein the anti-ferromagnetic layer structure comprises an artificial anti-ferromagnetic layer structure.

16. The magnetic random access memory cell of claim 15, wherein the artificial anti-ferromagnetic layer structure comprises:

a first magnetic layer having a first magnetic moment;
a second magnetic layer having a second magnetic moment; and
an anti-ferromagnetic layer disposed between the first and second magnetic layers, the first magnetic layer being in contact with the non-magnetic tunnel barrier layer structure.

17. A magnetic random access memory cell, comprising:
a reference layer structure that includes an anti-ferromagnetic layer structure pinning a magnetization orientation of the reference layer structure, wherein the anti-ferromagnetic layer structure comprises an artificial anti-ferromagnetic layer structure, the artificial anti-ferromagnetic layer structure comprising a first magnetic layer having a first magnetic moment, a second magnetic layer having a second magnetic moment, and an anti-ferromagnetic layer disposed between the first and second magnetic layers;
a free layer structure; and
a non-magnetic tunnel barrier layer structure disposed between the reference layer structure and the free layer structure, the first magnetic layer being in contact with the non-magnetic tunnel barrier layer structure, the reference layer structure having a higher magnetic coercivity than the free layer structure, and the reference layer structure being magnetically polarizable bidirectional and parallel to a magnetic field generated by a bit line electrode and parallel to a magnetic field generated by a word line electrode during a writing procedure so as to store information in the reference layer structure while heating the anti-ferromagnetic layer structure above its blocking temperature;
wherein at room-temperature the first magnetic moment and the second magnetic moment are balanced resulting in an absence of a magnetic offset field of the artificial anti-ferromagnetic layer structure, and at high temperature the first magnetic moment dominates over the second magnetic moment.

18. The magnetic random access memory cell of claim 16, wherein the first magnetic layer comprises cobalt iron boron and the anti-ferromagnetic layer comprises ruthenium.

19. The magnetic random access memory cell of claim 18, wherein the first magnetic layer has a thickness of approximately 18 Angstroms.

20. The magnetic random access memory cell of claim 13, wherein the anti-ferromagnetic layer structure comprises an iron manganese layer.

21. The magnetic random access memory cell of claim 20, wherein the iron manganese layer has a thickness of approximately 120 Angstroms.

22. The magnetic random access memory cell of claim 13, wherein the free layer structure comprises an artificial anti-ferromagnetic layer structure.

23. The magnetic random access memory cell of claim 22, wherein the artificial anti-ferromagnetic layer structure comprises a first magnetic layer having a first magnetic moment, a second magnetic layer having a second magnetic moment and an anti-ferromagnetic layer disposed between said first and said second magnetic layers, said first magnetic layer being in contact with the non-magnetic tunnel barrier layer structure.

24. A magnetic random access memory cell, comprising:
a reference layer structure that includes an anti-ferromagnetic layer structure pinning a magnetization orientation of the reference layer structure;
a free layer structure, wherein the free layer structure comprises an artificial anti-ferromagnetic layer structure, the artificial anti-ferromagnetic layer structure comprising a first magnetic layer having a first magnetic moment, a second magnetic layer having a second magnetic moment and an anti-ferromagnetic layer disposed between the first and the second magnetic layers; and
a non-magnetic tunnel barrier layer structure disposed between the reference layer structure and the free layer structure, the first magnetic layer being in contact with the non-magnetic tunnel barrier layer structure, the reference layer structure having a higher magnetic coercivity than the free layer structure, and the reference layer structure being magnetically polarizable bidirectional and parallel to a magnetic field generated by a bit line electrode and parallel to a magnetic field generated by a word line electrode during a writing procedure so as to store information in the reference layer structure while heating the anti-ferromagnetic layer structure above its blocking temperature;
wherein at room-temperature the second magnetic moment dominates over the first magnetic moment.

25. The magnetic random access memory cell of claim 24, wherein at room-temperature the second magnetic moment is about twice the first magnetic moment in amount.

26. The magnetic random access memory cell of claim 24, wherein at high temperature the first and the second magnetic moments are substantially balanced resulting in a substantial absence of a magnetic offset field of the free layer structure.

27. The magnetic random access memory cell of claim 23, wherein the first magnetic layer comprises cobalt iron boron and the anti-ferromagnetic layer comprises ruthenium.

28. The magnetic random access memory cell of claim 23, wherein the first magnetic layer has a thickness of approximately 25 Angstroms.

29. A method of writing to a magnetic access memory cell, the method comprising:
providing a magnetic access memory cell that includes a free layer structure adjacent a reference layer structure; and
applying a magnetic field thereby polarizing the reference layer structure in one of two possible directions parallel to one out of more than one possible axes so as to store information of more than one bit in the reference layer structure.

30. The method of claim 29, further comprising, while applying the magnetic field, heating the memory cell by applying a heating current.

31. The method of claim 29, wherein applying the magnetic field comprises generating the magnetic field by a field current through at least one of more than one field electrodes.

32. The method of claim 31, wherein generating the magnetic field comprises generating the magnetic field by the field current through a bit line electrode or through a word line electrode of the magnetic access memory cell.

33. The method of claim 31, wherein generating the magnetic field comprises generating the magnetic field by the field current through a bit line electrode and through a word line electrode of the magnetic access memory cell.

34. A method of reading a magnetic access memory cell, the method comprising:
providing a magnetic access memory cell that includes a free layer structure adjacent a reference layer structure;
applying a magnetic field thereby polarizing the free layer structure parallel to each axis of a plurality of axes; and
determining a tunnel magneto resistance status of the magnetic access memory cell thereby reading information of more than one bit.

35. A method of operating a magnetic access memory cell for reading, the method comprising:
providing a magnetic access memory cell that includes a free layer structure adjacent a reference layer structure;
applying a magnetic field thereby polarizing the free layer structure parallel to an axis of a plurality of axes; and
determining an axis aligned tunnel magneto resistance status and, if the axis aligned tunnel magneto resistance status represents neither a logical '0' state nor a logical '1' state, applying a magnetic field polarizing the free layer structure parallel to an other axis of the plurality of axes and again determining the axis aligned tunnel magneto resistance status.

36. The method of claim 35, wherein applying the magnetic field comprises generating the magnetic field by a field current through at least one of more than one field electrodes.

37. The method of claim 36, wherein generating the magnetic field comprises generating the magnetic field by the field current through a bit line electrode or through a word line electrode of the magnetic access memory cell.

38. The method of claim 36, wherein generating the magnetic field comprises generating the magnetic field by the field current through a bit line electrode and through a word line electrode of the magnetic access memory cell.

39. A method of operating a magnetic access memory cell for reading, the method comprising:
pulsing a field current through a bit line electrode;
pulsing a first read current through the magnetic access memory cell for determining a first axis aligned tunnel magneto resistance status;
pulsing a field current through a word line electrode; and
pulsing a second read current through the magnetic access memory cell for determining a second axis aligned tunnel magneto resistance status.

40. A method of operating a magnetic access memory cell for reading, the method comprising:
pulsing a field current through a bit line electrode;
pulsing a first read current through the magnetic access memory cell for determining a first axis aligned tunnel magneto resistance status;
pulsing a field current through a word line electrode; and
pulsing a second read current through the magnetic access memory cell for determining a second axis aligned tunnel magneto resistance status;
wherein the pulsing the field current through the word line electrode and the pulsing the second read current through the magnetic access memory cell are at least partially overlapping.

41. The method of claim 35, wherein determining the axis aligned tunnel magneto resistance status is used to read more than one bit of information from the magnetic access memory cell.

42. The method of claim 39, wherein pulsing the first read current and pulsing the second read current are used to read more than one bit of information from the magnetic access memory cell.

* * * * *